United States Patent [19]

Zimmerman et al.

[11] 4,116,520

[45] Sep. 26, 1978

[54] CLOSED ENTRY CONNECTOR HOUSING

[75] Inventors: Gary Lee Zimmerman, Shermansdale; Richard Paul Clark, Hershey; John A. Rehm, Mechanicsburg, all of Pa.

[73] Assignee: AMP Incorporated, Harrisburg, Pa.

[21] Appl. No.: 830,978

[22] Filed: Sep. 6, 1977

[51] Int. Cl.² ........................ H01R 13/40; H05K 1/12

[52] U.S. Cl. ............................. 339/59 R; 339/192 R

[58] Field of Search .............. 339/17 C, 17 LC, 59 R, 339/59 M, 192 R, 198 R, 198 P, 198 S, 176 M

[56] References Cited

U.S. PATENT DOCUMENTS

| | | | |
|---|---|---|---|
| 3,440,594 | 4/1969 | Hopp et al. | 339/59 R |
| 3,693,134 | 9/1972 | Trevisiol | 339/59 M |
| 3,697,933 | 10/1972 | Black et al. | 339/192 R |
| 4,025,151 | 5/1977 | Eigenbrode | 339/210 M |

*Primary Examiner*—Neil Abrams
*Attorney, Agent, or Firm*—Russell J. Egan

[57] ABSTRACT

An improved connector housing assembly is disclosed having a double row of contact cavities with both rows being closed entry. The double row of contact receiving cavities are separated by a wall having an integral hinged portion movable from a first position, in alignment with the cavities, to a second position normal to the cavities and closing one row of cavities.

6 Claims, 5 Drawing Figures

CLOSED ENTRY CONNECTOR HOUSING

BACKGROUND OF THE INVENTION

1. The Field Of The Invention

The present invention relates to a closed entry connector housing and in particular to a molded connector block receiving electrical contacts in a pair of rows with at least one row being closed at one end to prevent accidental shorting between contacts of the adjacent rows.

2. The Prior Art

Connector housings of the present type are used to house terminals or other electrical contact elements as desired. The terminals are inserted into open ended cavities formed within the housings and are held therein for engagement with mating contacts inserted into the cavities. In the case of housings molded from flexible thermoplastic, the terminals may be held in the cavities by means of integral molded flexible latches which are depressed during insertion and which snap back behind the terminals when the terminals are fully seated in the cavities. Alternately, a blocking tongue integral with the housing and connected thereto by a flexible thermoplastic strip may be inserted behind the terminals to hold them in place as shown, for example, in U.S. Pat. No. 3,693,134.

Flexible latches and blocking tongues cannot be used to confine terminals in cavities and connector housings molded of glass filled or otherwise filled thermoplastic material because the filling renders the molded plastic rigid. For this reason, terminals are held in cavities of these housings by the use of separate blocking pieces which are secured to the housing to close the terminal receiving cavities following insertion of the terminals as shown, for example, in U.S. Pat. No. 3,697,933. These separate pieces conventionally required to retain terminals in cavities in glass filled thermoplastic housings increase both manufacturing and storage costs. Increased labor is also required to position these pieces in the block following the insertion of the terminals.

It has been proposed, as a solution to the above-mentioned problem, to mold a rigid connector housing from a filled thermoplastic material with an integrally molded gate extending from one side adjacent an open ended row of terminal receiving cavities. The gate is secured to the connector housing by a rigid portion having thin resin rich layers at its opposite opposed surfaces and a rigid resin filled composite between the layers. When the gate is rotated towards the closed position, one resin layer and the composite are ruptured by the tensile force allowing the gate to rotate to the closed position about the remaining flexible resin rich layer. In this way an integral housing is formed to keep the parts in one location thereby lessening production storage and labor costs. Such a connector housing is disclosed in U.S. Pat. No. 4,025,151.

SUMMARY OF THE INVENTION

The present invention is a closed entry connector housing which receives a double row of contacts in two rows of contact receiving cavities. The contacts utilized in the subject connector housing have substantially identical mating portions. The contacts for one row have solder tabs of a first length extending from a first end while the contacts from the other row have solder tabs of a second longer length extending from the second end. The housing has a double row of contact receiving cavities separated by a wall, an integral rear portion of which is resiliently deflectable to a latch in such a position as to close one end of one row of cavities.

It is therefore an object of the present invention to produce an improved stackable connector housing having a double row of contact cavities, with both of the rows being closed entry cavities, including means to prevent shorting between the contacts in the two rows.

It is a further object of the present invention to produce a double row, closed entry connector housing wherein members closing one end of one row of contact receiving receptacles are integral with the housing thereby avoiding the use of loose pieces and the problems associated therewith.

It is a further object of the present invention to produce an improved closed entry double row connector housing which can be readily and economically produced.

The means for accomplishing the foregoing objects and other advantages will become apparent to those skilled in the art from the following detailed description taken with reference to the accompanying drawings.

DETAILED DESCRIPTION OF THE PREFERRED EMBODIMENT

Figure 1:
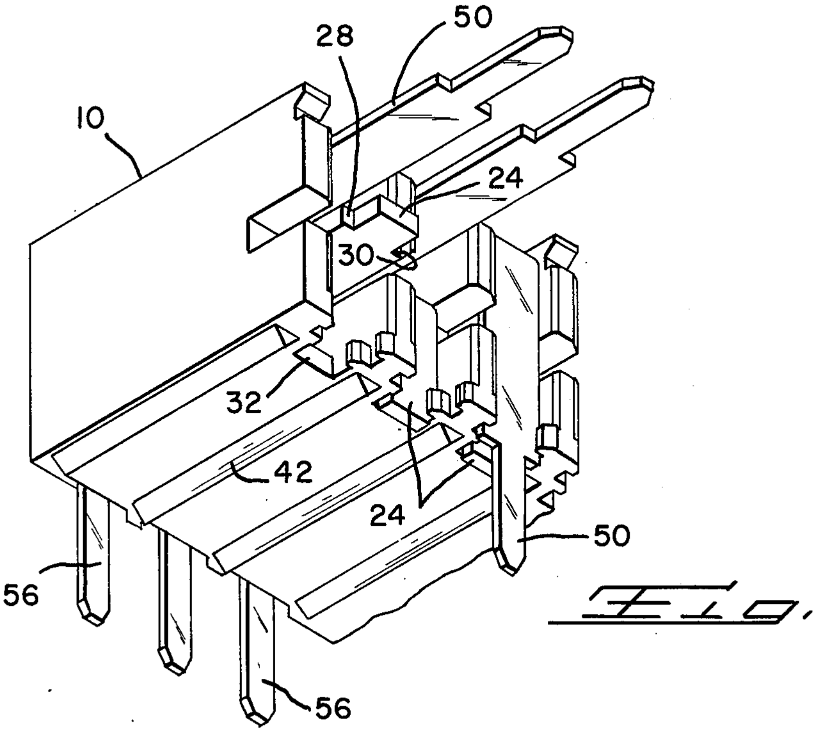
FIG. 1 is a perspective view of an end portion of the subject connector housing.
Figure 2:
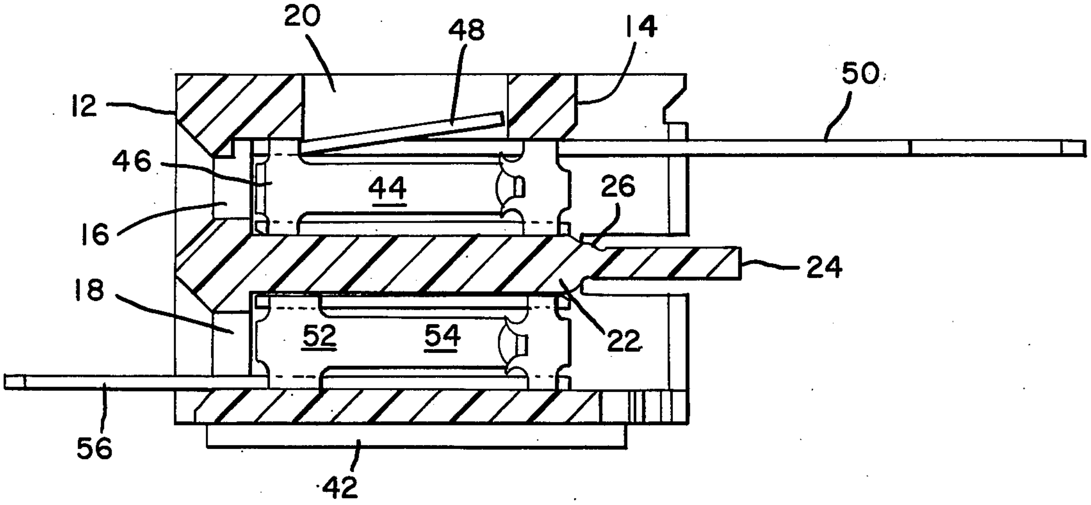
FIG. 2 is a transverse section through the subject connector in a partially assembled condition.

One end of the subject connector housing 10 is shown in FIG. 1 in a partially assembled condition. The connector housing 10 is an integral molded member having a front mating face 12 and a rear face 14. A plurality of upper contact receiving cavities 16 and lower contact receiving cavities 18 are formed in the housing in a pair of parallel spaced rows. The upper recesses are each intersected by a transverse aperture 20. The upper and lower cavities are separated by an intermediate wall 22 which includes an integral rear portion 24 connected thereto by a resilient hinge 26. The rear portion 24 has a stepped profile defined by shoulders 28, 30 and latchingly engages in the profiled recess 32 including inwardly directed projections 34 and 36 defining housing and contact notches 38, 40, respectively. The housing also includes a plurality of integral ribs or feet 42 which serve as stand-off members when the housing is mounted on a flat surface.

The upper contacts 44 include a receptacle portion 46, a locking lance 48, and a solder tab 50. The lower contacts 52 include a receptacle portion 54 and a solder tab 56 which is of somewhat lesser length than the solder tab 50 and extends from the opposite end of the receptacle portion.

Figure 3:
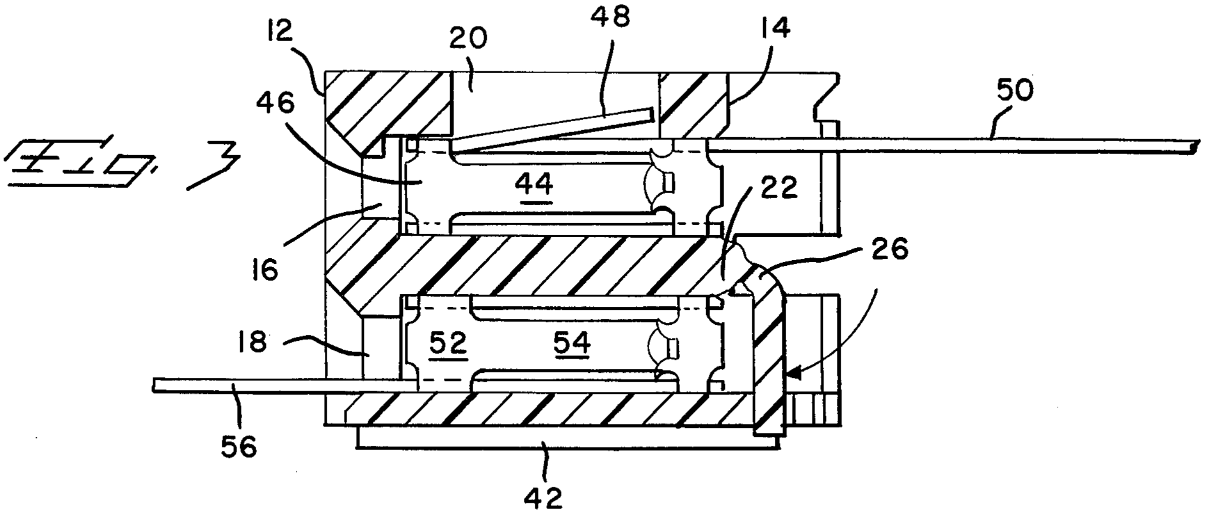
FIG. 3 is a transverse section, similar to FIG. 2, showing the next sequential step in the assembly of the connector.
Figure 4:
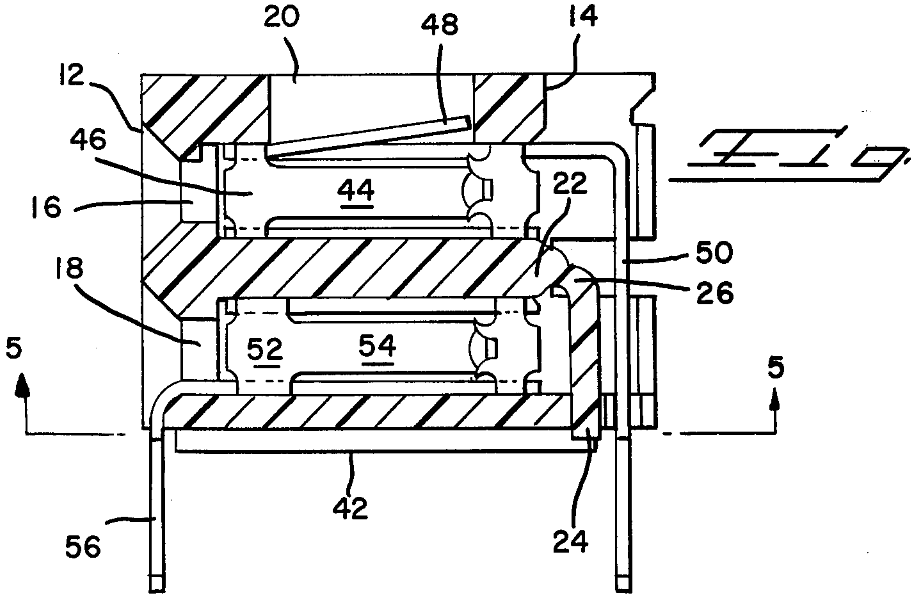
FIG. 4 is a transverse section, similar to FIGS. 2 and 3, showing the fully assembled connector.
Figure 5:
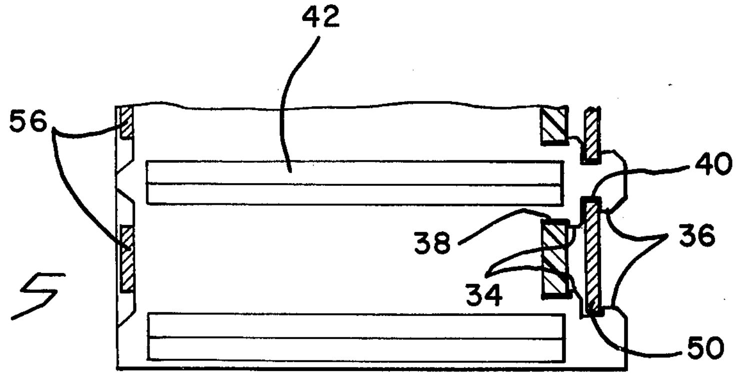
FIG. 5 is a horizontal section taken along lines 5—5 of FIG. 4.

The contacts 44 and 52 are loaded into the connector housing from the rear face 14 with the solder tab 50 of contact 44 extending to the rear and solder tab 56 of contact 52 projecting through the front face 12. The rear portion 24 of the intermediate wall 22 is rotated downwardly, as shown in FIG. 3, to until the stepped profile engages in the housing notches 38. The respective solder tabs 50, 56 are then bent normal to the longitudinal axis of the contacts, as shown in FIG. 5. The solder tab 50 of contact 44 is received in contact notches 40 and is secured thereby.

The present invention may be subject to many modifications and changes without departing from the spirit or essential characteristics thereof. The present embodiment is therefore to be considered in all respects as merely illustrative and not restrictive of the scope of the invention. .9n

What is claimed is:

1. A closed entry electrical connector assembly comprising:

a housing of insulating material having a mating face, a bottom wall, parallel upper and lower rows of contact receiving cavities opening onto said mating face, each row having a like plurality of cavities, an intermediate wall separating said rows of cavities, said intermediate wall having an end portion remote from said mating face moveable from a first portion in the plane of the wall to a second position extending normal to the plane of the wall and closing one end of said lower row of cavities locking means in said bottom wall receiving said end portion in said second position;

a like plurality of first electrical terminals received in said upper row of cavities; and a like plurality of second terminals received in the lower row of cavities.

2. A closed entry electrical connector assembly according to claim 1 wherein:

said first and second terminals each having a mating portion lying within a respective contact receiving cavity;

said first terminals each having a solder tab extending from a first end of said mating portion and being of sufficient length to reach past the bottom wall of said housing; and said second terminals each having a solder tab extending from a second end of said mating portion and being of sufficient length to reach past the bottom wall of said housing.

3. A closed entry electrical connector assembly according to claim 2 wherein:

said mating portions of said first and second terminals are receptacles.

4. A closed entry electrical connector assembly according to claim 2 further comprising:

second locking means adjacent and outwardly of said first locking means lockingly receiving said solder tabs of said first terminals.

5. A closed entry electrical connector assembly according to claim 1 further comprising:

at least one stand-off means fixedly extending from the bottom of said housing.

6. An electrical connector housing comprising:

an elongated member of substantially rigid insulating material having a mating face, a bottom wall, upper and lower parallel rows of contact receiving cavities opening on said mating face, and an intermediate wall separating said rows of cavities, an end portion of said wall remote from said mating face being moveable from a first position in the plane of the wall to a second position extending normal to the plane of the wall, locking means in said bottom wall lockingly receiving the free end of said end portion in said second position, and stand-off means fixed to said bottom wall.

* * * * *